(12) United States Patent
Katsuki et al.

(10) Patent No.: US 9,800,073 B2
(45) Date of Patent: Oct. 24, 2017

(54) MODELING A CHANGE IN BATTERY DEGRADATION

(71) Applicant: INTERNATIONAL BUSINESS MACHINES CORPORATION, Armonk, NY (US)

(72) Inventors: Takayuki Katsuki, Tokyo (JP); Tetsuro Morimura, Tokyo (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 112 days.

(21) Appl. No.: 14/831,378

(22) Filed: Aug. 20, 2015

(65) Prior Publication Data

US 2017/0054317 A1    Feb. 23, 2017

(51) Int. Cl.
*H02J 7/00*    (2006.01)
(52) U.S. Cl.
CPC .................. *H02J 7/0068* (2013.01)
(58) Field of Classification Search
CPC ..................................... H02J 7/0068
USPC ........................................... 320/134
See application file for complete search history.

(56) References Cited

U.S. PATENT DOCUMENTS

| 7,489,106 B1* | 2/2009 | Tikhonov | H02J 7/0018 320/116 |
| 2009/0027056 A1* | 1/2009 | Huang | B60L 11/1857 324/439 |
| 2015/0281625 A1* | 10/2015 | Innes | H04N 5/4403 348/734 |

OTHER PUBLICATIONS

Takahashi et al., "Predicting Battery Life from Usage Trajectory Patterns," 21st International Conference on Pattern Recognition (ICPR 2012), Nov. 11-15, 2012, pp. 2946-2949, Tsukuba, Japan.

* cited by examiner

*Primary Examiner* — Suresh Memula
(74) *Attorney, Agent, or Firm* — Tutunjian & Bitetto, P.C.; Vazken Alexanian

(57) ABSTRACT

A battery controller and method for controlling a battery include training parameters for a battery capacity prediction model based on usage pattern information that correlates usage of similar batteries with capacity information for the respective similar batteries. The model characterizes a capacity decay rate in accordance with a present value of the battery capacity. Future battery capacity is predicted for a battery under control based on the battery capacity prediction model and a present value of the battery capacity. One or more operational parameters of the battery under control are controlled based on the predicted future battery capacity to extend the battery's usable lifetime.

13 Claims, 2 Drawing Sheets

MODELING A CHANGE IN BATTERY DEGRADATION

BACKGROUND

Technical Field

The present invention relates to battery degradation and, in particular, to measuring and predicting battery degradation.

Description of the Related Art

As rechargeable batteries become integrated more deeply in every-day operations, including mobile computing devices, electric vehicles, smart grids, and the like, improved analysis of the performance of such batteries becomes a pressing concern. In particular, battery life is degraded through use. Predicting and controlling capacity retention rate (i.e., battery life) from usage history is particularly important, as the capacity retention rate is directly related to the remaining usable time of the vehicle or device.

Existing models for predicting capacity retention rate include the square root law model. In this model, capacity retention rate is degraded proportional to the square root of the cumulative use time due to formation of a solid-electrolyte interphase (SEI) layer on the anode of the battery. This applies particularly to lithium-based batteries, as the SEI layer reduces the lithium ion irreversibly, and its accumulation is proportional to the square root of the cumulative use time. Thus, following the square root law model, the capacity retention rate is modeled as $y=-at^b+c$, where t is the cumulative use time, b is generally ½, and a and c are parameters that depend on the particular battery.

However, in many real-world applications, battery degradation is not simply proportional to the square root of the cumulative use time. As a result, the square root law model is not adequate for high-precision analysis of batteries' capacity retention rates.

SUMMARY

A method for controlling a battery includes training parameters for a battery capacity prediction model based on usage pattern information that correlates usage of similar batteries with capacity information for the respective similar batteries. The model characterizes a capacity decay rate in accordance with a present value of the battery capacity. Future battery capacity is predicted for a battery under control based on the battery capacity prediction model and a present value of the battery capacity. One or more operational parameters of the battery under control are controlled based on the predicted future battery capacity to extend the battery's usable lifetime.

A battery controller includes a processor configured to train parameters for a battery capacity prediction model based on usage pattern information that correlates usage of similar batteries with capacity information for the respective similar batteries and further configured to predict future battery capacity for a battery under control based on the battery capacity prediction model and a present value of the battery capacity. The model characterizes a capacity decay rate in accordance with a present value of the battery capacity. A battery interface configured to control one or more operational parameters of the battery under control based on the predicted future battery capacity to extend the battery's usable lifetime.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
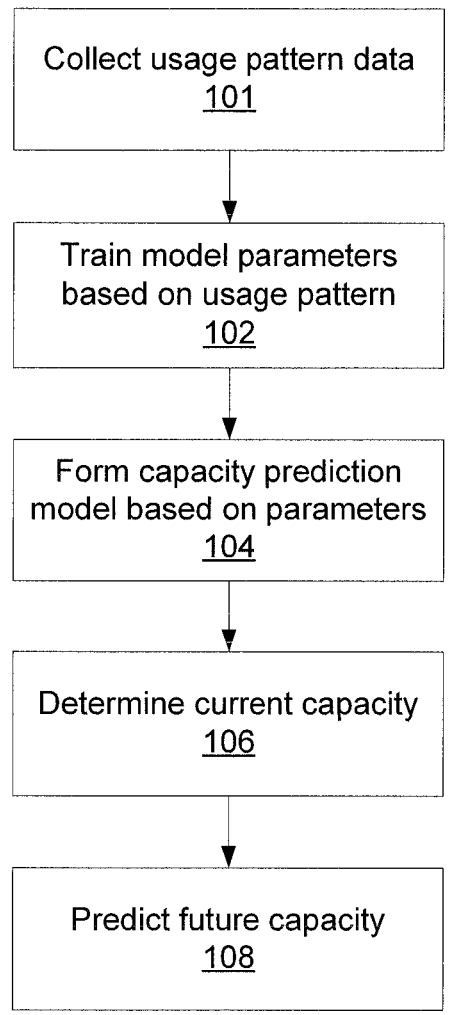
FIG. 1 is a block/flow diagram of a method of controlling a battery in accordance with the present principles.

Embodiments of the present invention provide predictions of battery lifetime that are based on a balance of self-discharge rates and residual amounts of lithium ions. As noted above, the battery capacity of a lithium ion battery is time-dependent, with the formation of a solid-electrolyte interphase (SEI) layer at the anode of the battery decreasing the number of available lithium ions in a battery, but at the same time inhibiting self-discharge of the battery, which would otherwise lead to the battery draining more quickly. As a result, a balance between these two factors is needed to accurately predict the capacity retention rate and lifetime of the battery, taking into account both the early advantageous effects of the SEI layer formation as well as the long-term degradation of the battery capacity.

To accomplish this, a model is employed using a recursive function that captures the present state of the battery's capacity retention rate. Thus, the capacity retention rate is modeled as $y=-at^{b(y,\theta)}+c$, where t is the cumulative time, a and c are parameters that depend on the battery, and $b(y,\theta)$ is a function that changes according to the current value of the capacity retention rate y and a parameter $\theta$. The parameter a refers to the gradient of the degradation curve, while the parameter c refers to the initial capacity retention rate, usually normalized to 1. The specific functional form of $b(y,\theta)$ is arbitrary and may be linear (e.g., $\theta_0+\theta_1 y$) or non-linear (e.g., $\theta_0+\theta_1 y+\theta_2 y^2+\theta_3 y^3+ \ldots$ ) and may be selected empirically to minimize cross validation error.

The inference of the model parameters is non-trivial. To simplify determining the parameters, an approximation of the model is used, such that parameter estimation methods from the conventional models can be used. Thus, while the capacity retention rate at a time t is $y_t=-a(t)^{b(y_t,\theta)}+c$, using the capacity retention rate at a time $t-\Delta t$, the approximate capacity retention rate can be expressed as: $y_t \approx -at^{b(y_{t-\Delta t},\theta)}+c$. The immediately prior value, $y_{t-\Delta t}$, can be measured roughly from the history of the battery usage based on how much electric current has been used or charged into the battery. Alternatively, the current capacity can be measured directly in a vehicle bench test.

The above approximation allows the use of existing techniques for estimating the parameters a, c, and $\theta$. Given the availability of training data that includes the history of usage patterns and capacity retention rates for similar devices, the parameters can be determined to minimize the inconsistency between the true capacity retention rates in the history and the estimated capacity retention rates by using the present model and the usage patterns from the history. Gradient-based methods, a grid search, or trajectory regression can be used to this end. These formulations can be extended to a fully Bayesian formulation to optimize the different parameters simultaneously. In particular, a trajectory regression approach may be employed to learn the parameter a.

This model produces significantly better results than the square root law model. In experiments using a model that includes $b=\theta_0+\theta_1 y$, with a learned by trajectory regression as a function of usage history and other parameters learned by a grid search with cross validation, a ten percent improvement in the root mean squared error resulted. In a comparison of the models' performance using well degraded data, where the capacity had degraded to less than 60% of its maximum, the root mean squared error decreased by 30% using the present model. In the most severe cases, the present embodiments reduced the root mean squared error by half.

Referring now to the drawings in which like numerals represent the same or similar elements and initially to FIG. 1, a method of modeling battery degradation is shown. Block 101 collects usage pattern data and corresponding capacity retention rate data for the battery, establishing how the capacity has changed over time. A usage pattern may include, for example, sets of timestamps, electric current, voltage, and temperature arranged in a sequence. The usage pattern may also include a difference in states of charge between the beginning and end of a discharge cycle and/or the beginning and end of a charge cycle. For example, if a battery is used to power a motor and discharges from a state of charge of 90% to a state of charge of 80%, the difference stored is −10%. If the battery is at 80% when a charging cycle begins and at 100% when the charging cycle ends, then the difference is +20%. Any subset of these values or values computed from them, such as state of charge for the battery, may be included instead. The information is obtained from sensors in the battery itself or by external sensor devices.

Block 102 trains the model parameters based on the battery's usage pattern and corresponding capacity retention rate. As noted above, this training step may include any appropriate technique for determining the parameters, including conventional techniques based on the square law model if the present model is approximated. Block 104 forms the model based on the parameters, using the parameters to fit the functional form of $b(y,\theta)$ to the existing usage data. Using the model, block 106 determines the current capacity of the battery and block 108 predicts the future capacity.

One use for this prediction is to determine the optimal parameters for extending battery lifetime. By predicting the lifetime under different usage patterns, a best usage pattern can be determined. This may include operating temperature, terminal voltage, and current flow. The best usage pattern may also include maintaining optimal state of charge levels using differences in the state of charge, as batteries may degrade differently based on what state of charge is maintained. Knowledge of this best usage pattern can aid in the design of batteries as well as allow for in-use optimization for long battery life. Recommendations can also be made to users regarding the optimal environment for the battery, specifying for example terminal voltages and temperatures that will extend battery life.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 2:
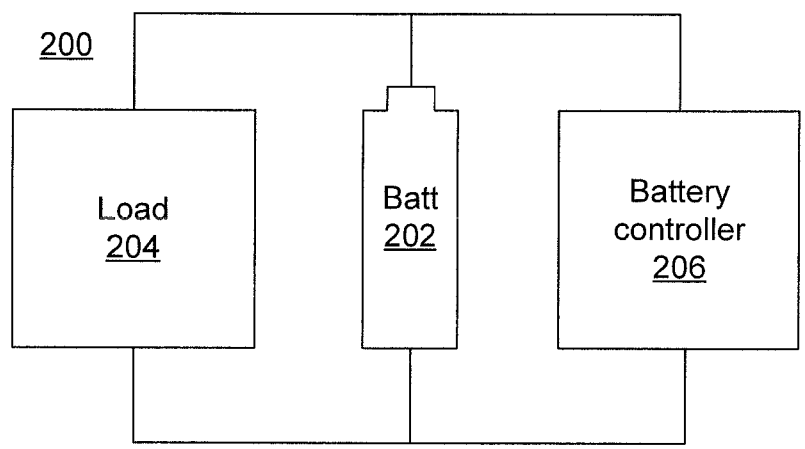
FIG. 2 is a block diagram of a battery and battery controller in accordance with the present principles.

Referring now to FIG. 2, a battery system 200 is shown. The battery 202 is connected to a load 204. It is specifically contemplated that the battery 202 is a lithium ion battery, but it should be understood that the present principles are not limited to that specific battery chemistry. The present model may be adapted to any battery chemistry, as it is adaptable through the learning of parameters to any battery degradation mechanism. The load 204 can be any type of load, and it is specifically contemplated that the load 204 may be a mobile computing device, a mobile telephone, an electric car, or any other electronic device that uses batteries over a significant period of time.

A battery controller 206 monitors the state of the battery 202 and its usage patterns. The usage patterns reflect how the load 204 discharges the battery 202 over time. The usage patterns may also reflect direct measurements of the battery 202. In addition to monitoring the battery 202, the battery controller 206 can also affect the charge/discharge of the battery, taking measures to preserve and extend the battery's usable lifetime. Notably, the battery 202 or battery controller 206 can change its own operating parameters, such as the maximum or minimum terminal voltages as well as the charging speed. Altering the maximum and minimum terminal voltages is equivalent to altering the maximum and minimum states of charge, and can be advantageous if a high or low state of charge causes accelerated degradation of battery life according to the present model. The battery controller 206 can further control the maximum or minimum terminal voltages according to the temperature of the battery during use if a certain of high or low temperature and high or low terminal voltage results in increased degradation of the battery life. Similarly, increasing or decreasing the charging speed of the battery, by adjusting the amount of current supplied, can help reduce degradation if a low or high battery charge speed is found to cause degradation.

Figure 3:
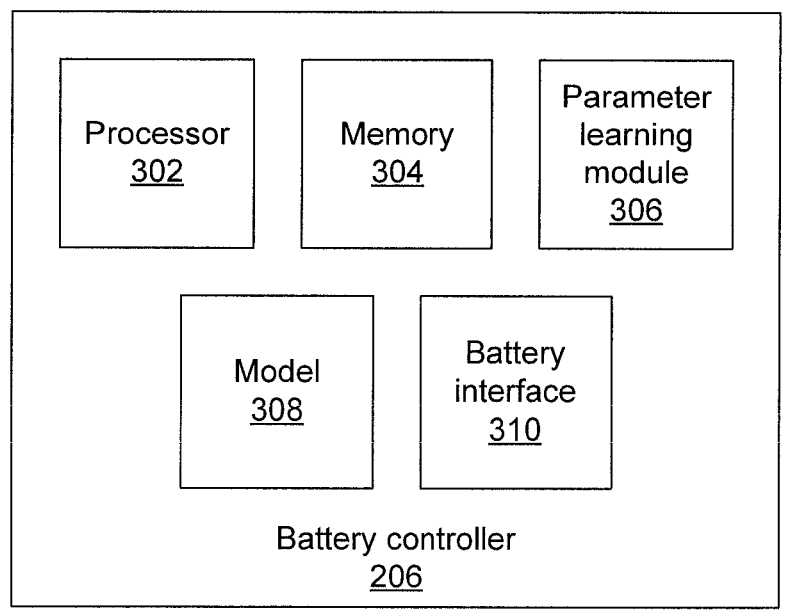
FIG. 3 is a block diagram of a battery controller in accordance with the present principles.

Referring now to FIG. 3, a block diagram of the battery controller 206 is shown. The battery controller 206 includes a hardware processor 302 and memory 304. It should be noted that the battery controller 206 may include one or more software components which may, in the alternative, be implemented as hardware components using, e.g., an application specific integrated chip or field programmable gate array. A battery interface 310 provides an interface between the controller 206 and the battery 202. The interface 310 may include information gathering abilities, through monitoring the voltage output of the battery 202 and by making other direct measurements of the battery 202, as well as providing control over the battery 202 through controlling, e.g., its charge and discharge rates. The battery interface 310 may monitor the state of the battery 202 and load 204 directly by monitoring the electrical characteristics of the connection between the devices, or may alternatively interface with one or more sensors internal or external to the battery 202.

The battery interface 310 thereby collects information from the battery 202 regarding usage patterns, which are stored in the memory 304. The parameter learning module 306 uses the processor 302 to learn parameters for the model 308 based on the stored usage pattern information. The parameter learning module 306 may use any appropriate parameter learning/training technique, including regression analysis and neural networks. The processor 302 then uses the model 308 to generate predictions regarding, e.g., the capacity retention rate of the battery 202 and instructs the battery interface 310 to implement any changes needed to extend the battery's usable lifetime. The battery interface 310 may then control operational parameters of the battery 202 and/or provide feedback to a user regarding optimal usage patterns that may be employed to extend the battery's lifetime.

Having described preferred embodiments of modeling a change in battery degradation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for controlling a battery, comprising:
training parameters for a battery capacity prediction model based on usage pattern information that correlates usage of similar batteries with capacity information for the respective similar batteries, wherein the model characterizes a capacity decay rate in accordance with a present value of the battery capacity;
predicting future battery capacity for a battery under control based on the battery capacity prediction model and a present value of the battery capacity; and
controlling one or more operational parameters of the battery under control based on the predicted future battery capacity to extend the battery's usable lifetime.

2. The method of claim 1, wherein a usage pattern comprises a timestamp, an electric current, a voltage, and a temperature.

3. The method of claim 2, wherein the usage pattern further comprises a state of charge or difference in state of charge.

4. The method of claim 1, wherein the model accounts for an initial increase in battery capacity over time followed by a decline in battery capacity that is proportional to a square root of time elapsed.

5. The method of claim 1, wherein controlling one or more operational parameters of the battery comprises setting a maximum or minimum terminal voltage in accordance with usage patterns and the prediction.

6. The method of claim 1, wherein controlling one or more operational parameters of the battery comprises setting a charging speed of the battery in accordance with usage patterns and the prediction.

7. A non-transitory computer readable storage medium comprising a computer readable program for controlling a battery, wherein the computer readable program when executed on a computer causes the computer to perform the steps of:
training parameters for a battery capacity prediction model based on usage pattern information that correlates usage of similar batteries with capacity information for the respective similar batteries, wherein the model characterizes a capacity decay rate in accordance with a present value of the battery capacity;
predicting future battery capacity for a battery under control based on the battery capacity prediction model and a present value of the battery capacity; and
controlling one or more operational parameters of the battery under control based on the predicted future battery capacity to extend the battery's usable lifetime.

8. A battery controller, comprising:
a processor configured to train parameters for a battery capacity prediction model based on usage pattern information that correlates usage of similar batteries with capacity information for the respective similar batteries, wherein the model characterizes a capacity decay rate in accordance with a present value of the battery capacity, and further configured to predict future battery capacity for a battery under control based on the battery capacity prediction model and a present value of the battery capacity; and
a battery interface configured to control one or more operational parameters of the battery under control based on the predicted future battery capacity to extend the battery's usable lifetime.

9. The battery controller of claim 8, wherein a usage pattern comprises a timestamp, an electric current, a voltage, and a temperature.

10. The battery controller of claim 9, wherein the usage pattern further comprises a state of charge or difference in state of charge.

11. The battery controller of claim 8, wherein the model accounts for an initial increase in battery capacity over time followed by a decline in battery capacity that is proportional to a square root of time elapsed.

12. The battery controller of claim 8, wherein the battery interface is configured to set a maximum or minimum terminal voltage in accordance with usage patterns and the prediction.

13. The battery controller of claim 8, wherein the battery interface is configured to set a charging speed of the battery in accordance with usage patterns and the prediction.

* * * * *